(12) United States Patent
Mizutani (10) Patent No.: US 6,239,663 B1
(45) Date of Patent: May 29, 2001

(54) HIGH-FREQUENCY OSCILLATOR USING FETS AND TRANSMISSION LINES

(75) Inventor: Hiroshi Mizutani, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/482,079

(22) Filed: Jan. 13, 2000

(30) Foreign Application Priority Data

Jan. 13, 1999 (JP) .................................................. 11-005918

(51) Int. Cl.[7] ...................................................... H03B 5/18
(52) U.S. Cl. ............................... 331/107 SL; 331/117 FE
(58) Field of Search ........................... 331/167, 107 SL, 331/117 R, 117 FE, 117 D, 108 C (56) References Cited

U.S. PATENT DOCUMENTS

| 4,528,524 | 7/1985 | Bert ......................................... 331/56 |
| 5,187,451 | * 2/1993 | Nakamoto et al. ............... 331/117 D |
| 5,483,206 | * 1/1996 | Lohninger ....................... 331/107 SL |
| 6,104,255 | * 8/2000 | Goma et al. ...................... 331/117 D |

FOREIGN PATENT DOCUMENTS

| 59-79607 | 5/1984 | (JP) . |
| 9-260945 | 10/1997 | (JP) . |
| 11-150418 | 6/1999 | (JP) . |

* cited by examiner

Primary Examiner—Tuan T. Lam
(74) Attorney, Agent, or Firm—Foley & Lardner

(57) ABSTRACT

A high-frequency oscillator is provided, which decreases the phase noise and which has excellent mass productivity and reproducibility. This oscillator is comprised of (a) first, second, and third FETs formed on a substrate; (b) a first transmission line formed on the substrate; the first line being connected to drains of the first and second FETs formed on the substrate; (c) a second transmission line formed on the substrate; the second line being connected to gates of the first and second FETs; (d) a third transmission line formed on the substrate; the third line being connected to sources of the first and second FETs; (e) a fourth transmission line formed on the substrate; the fourth line being connected to the drain of the second FET and a drain of the third FET; (f) a fifth transmission line formed on the substrate; the fifth line being connected to the gate of the second FET and a gate of the third FET; and (g) a sixth transmission line formed on the substrate; the sixth line being connected to the source of the second FET and a source of the third FET. The first, second, and third transmission lines are coupled together due to electromagnetic field, and the fourth, fifth, and sixth transmission lines are coupled together due to electromagnetic field.

9 Claims, 10 Drawing Sheets

FIG. 1
PRIOR ART

A : IDEAL OSCILLATION SPECTRUM
 ($\delta$ FUNCTION)
B : ACTUAL OSCILLATION SPECTRUM

| PARAMETER NAME | PARAMETER VALUE |
|---|---|
| BETA | 1E-3 /V |
| GAMMA | 2.5 /V |
| VOUT0 | 2 V |
| VT0 | -1.2 V |
| A0 | 0.07 A |
| A1 | 0.07 S |
| A2 | -0.01 A/V$^2$ |
| A3 | -0.02 A/V$^3$ |
| Tau | 1E-12 sec |
| VB0 | 4 V |
| VBI | 0.64 V |
| RF | 4 ohm |
| IS | 3.2E-12 |
| N | 1.43 |
| RDS | 580 ohm |
| CRF | 4E-10 |
| RD | 1 ohm |
| RG | 1.7 ohm |
| RS | 1 ohm |
| Rin | 1.7 ohm |
| CGSO | 3E-13 F |
| CGDO | 3E-13 F |
| FC | 0.5 |
| CDS | 4.9E-14 F |
| CGS | 2E-13 F |
| CGD | 1E-14 F |
| KF | 0 |
| AF | 1 |
| TNOM | 27 °C |
| XTI | 3 |
| EG | 1.11 eV |
| VTOTC | 0 |
| BETATCE | 0 |
| FFE | 1 |
| Lg | 0.03 nH |
| Ls | 5E-3 nH |
| Ld | 0.005 nH |
| Cpg | 0.01 pF |
| Cpd | 0.01 pF |

HIGH-FREQUENCY OSCILLATOR USING FETS AND TRANSMISSION LINES

BACKGROUND OF THE INVENTION

1. Field of the Invention

The present invention relates to a high-frequency oscillator. More particularly, the invention relates to a high-frequency oscillator using Field-Effect Transistors (FETs) and electromagnetically-coupled transmission lines, which is applicable to the microwave or millimeter wave ranges.

2. Description of the Prior Art

In a high-frequency oscillator using an FET where the output of the FET is positively fedback to its input, generally, some phase error tends to occur between the input and output of the FET due to the 1/f noise and the white noise generated in the FET. The resonant or oscillation frequency of the oscillator shifts automatically so as to eliminate or decrease the phase error according to the Kirchhoff's law. Thus, the oscillation frequency tends to fluctuate, resulting in a wide-based spectrum B in FIG. 1.

Figure 1:
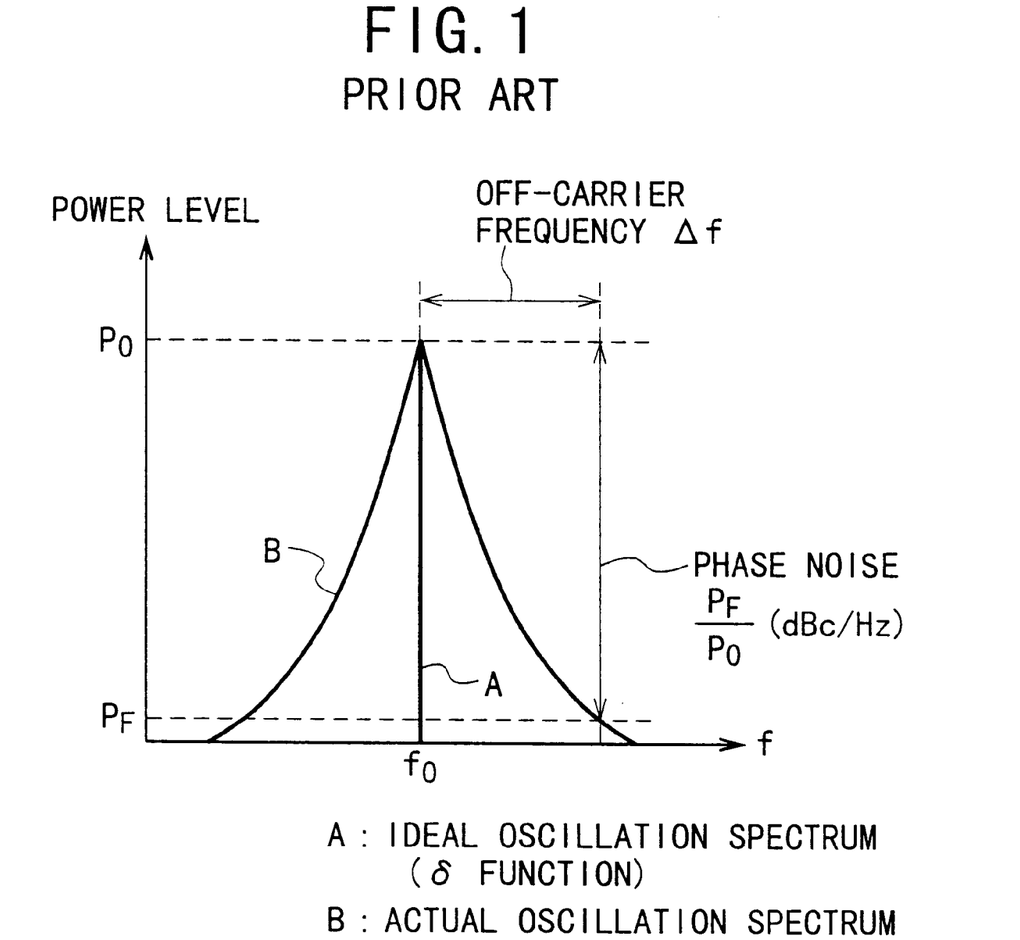
FIG. 1 is a graph showing the relationship between the power level and the frequency of high-frequency oscillators.

Ideally, the oscillation frequency of the oscillator is kept at a single value and therefore, it has a linear spectrum A shown in FIG. 1, i.e., it is expressed by the well-known $\delta$ function.

The word "phase noise" is defined as the ratio ($P_F/P_0$) of the power level $P_F$ at the frequency apart from the central oscillation frequency by an offset (i.e., off-carrier) frequency $\Delta f$ with respect to the power level $P_0$ at the central oscillation frequency, which is expressed by the unit "dBc/Hz". It is preferred that the value of the phase noise is as small as possible. In other words, as the value of the phase noise becomes smaller, the capacity or performance of the oscillator becomes higher.

The fluctuation of the oscillation frequency, i.e., phase noise, varies dependent upon the 1/f noise and the load QL of the resonator. Thus, to reduce the phase noise, it is required to decrease the 1/f noise and to increase the load $Q_L$.

The main cause of the 1/f noise is the time constant distribution of the recombination centers existing at the surfaces of the semiconductor of the FET and the interfaces therein. Therefore, not only the 1/f noise is difficult to be controlled but also it tends to affect the lateral-type semiconductor device such as the FET. To suppress the effect of the 1/f noise, a vertical-type semiconductor device such as a heterojunction bipolar transistor is often used instead of the FET. Alternately, a suitable measure to increase the load $Q_L$ is often taken.

Figure 2:
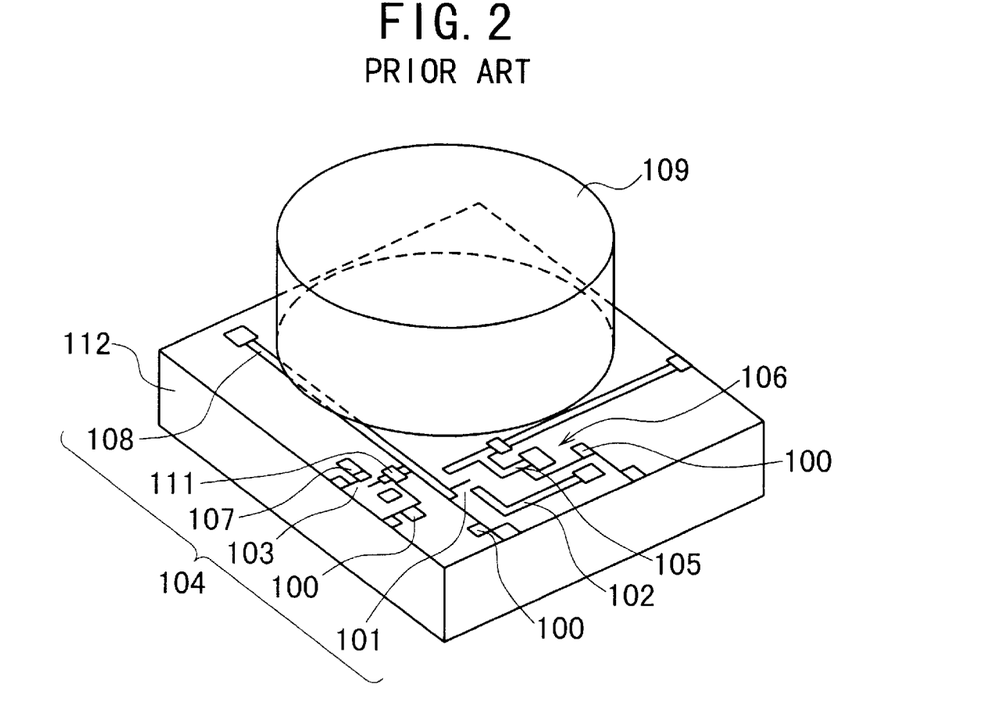
FIG. 2 is a perspective diagram showing the configuration of a prior-art high-frequency oscillator.

Various high-frequency oscillators formed by the FET that operates in the microwave or millimeter-wave range have been developed and reported, an example of which is shown in FIG. 2. The prior-art oscillator of FIG. 2 is disclosed in the Japanese Non-Examined Patent Publication No. 9-260945 published in October 1997.

As shown in FIG. 2, this prior-art oscillator is equipped with a dielectric resonator 109 to decrease the phase noise. A bypass capacitor 100, an oscillation FET 101, a feedback stub 102, a varactor element 103, an oscillation circuit 104, an output matching circuit 105, an output circuit 106, capacitors 107 and 111, and a coupling line 108 are formed on a Gallium Arsenide (GaAs) substrate 112.

In the prior-art oscillator shown in FIG. 2, the load $Q_L$ is increased to reduce the phase noise by using the dielectric resonator 109 with a high Q value. For example, if the value of the load $Q_L$ is increased to ten times its original value, the phase noise is decreased to one-hundredth ($\frac{1}{100}$) (i.e., -20 dB). Thus, this oscillator has an advantage that the phase noise can be effectively decreased. However, it has a problem that the mass productivity is not high and that the oscillator size or scale is large.

Figure 3:
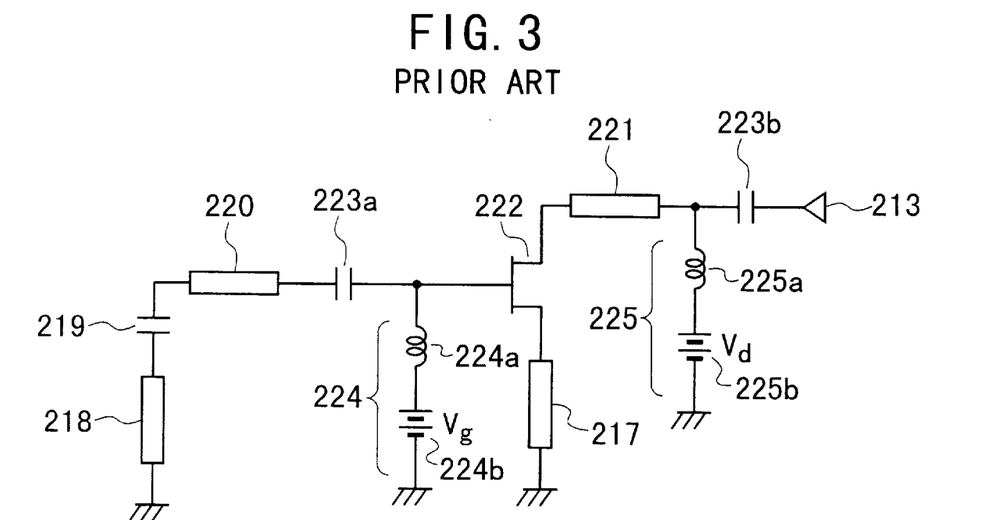
FIG. 3 is a circuit diagram showing the circuit configuration of another prior-art high-frequency oscillator.

Another example of the prior-art high-frequency oscillators of this sort is shown in FIG. 3, which is of the series feedback type and which has an advantage that both the mass productivity and the reproducibility are excellent.

As shown in FIG. 3, this prior-art oscillator comprises an FET 222. A transmission line 217, which serves to generate a negative resistance, is connected to the source of the FET 222. A transmission line 221 is connected to the drain of the FET 222. The line 221 is further connected to an output terminal 213 through a dc-blocking capacitor 223b. A transmission line 220 is connected to the gate of the FET 222 through a dc-blocking capacitor 223a. The line 220 is further connected to a transmission line 218 through a capacitor 219. The line 218 serves as an inductor determining the oscillation frequency. The capacitor 219 serves to determine the oscillation frequency along with the line 218.

A gate bias circuit or line 224 is connected to the gate of the FET 222. The circuit 224 comprises an inductor 224a and a voltage source 224b providing a bias voltage $V_g$. A drain bias circuit or line 225 is connected to the connection point of the transmission line 221 and the capacitor 223b. The circuit 225 comprises an inductor 225a and a voltage source 225b providing a bias voltage $V_d$.

To examine the performance of the prior-art oscillator shown in FIG. 3, the inventor carried out simulation using a known circuit simulator under the following condition, in which the 1/f noise was not considered.

On the assumption that the prior-art oscillator of FIG. 3 is formed on a GaAs substrate with a thickness of 40 μm, the relative dielectric constant εr was set as 12.6. The transmission line 217 was supposed to be a microstrip line with a width of 10 μm and a length of 100 μm. The transmission line 218 was supposed to be a microstrip line with a width of 10 μm and a length of 900 μm. The capacitance of the capacitor 219 determining the oscillation frequency was set as 100 fF. The transmission line 220 was supposed to be a microstrip line with a width of 300 μm and a length of 270 μm. The transmission line 221 was supposed to be a microstrip line with a width of 300 μm and a length of 276 μm. The capacitance of the dc-blocking capacitors 223 was set as 1 pF. The gate bias voltage $V_g$ was set as -0.5 V. The drain bias voltage $V_d$ was set as 4.5 V.

Figure 4:
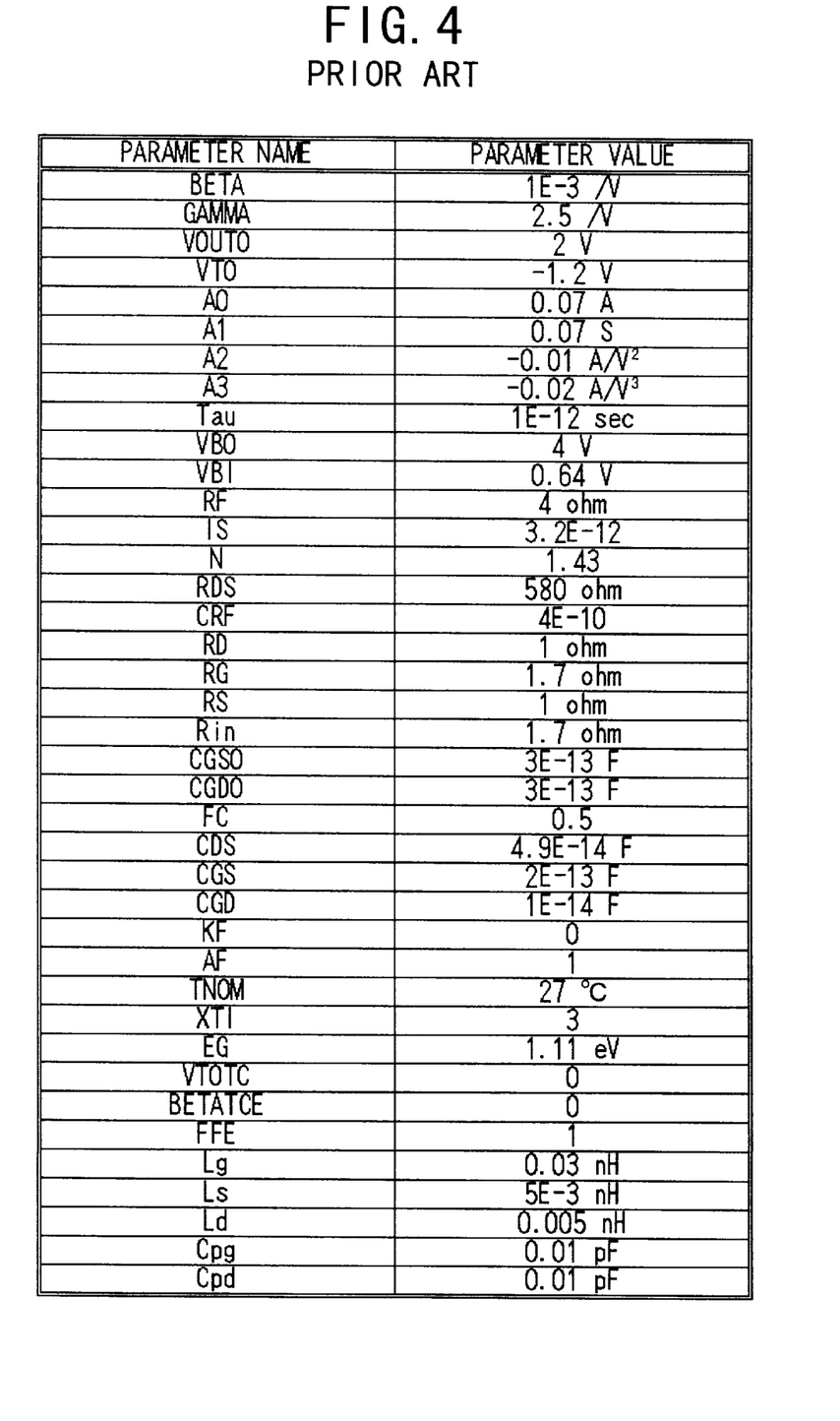
FIG. 4 is a table showing the nonlinear FET parameters used in the circuit simulation of the prior-art high-frequency oscillator shown in FIG. 3.

With respect to the FET 222, the FET 222 was supposed to be an FET having the AlGaAs/InGaAs heterojunction and the gate width Wg of 200 μm. Then, a nonlinear FET model was obtained by using the "Curtice Cubic" model. Using the nonlinear FET model thus obtained, the output power of the oscillator was analyzed by the Harmonic Balance method while the nonlinear FET parameters as shown in FIG. 4 were used. In FIG. 4, Lg, Ls, Ld are the gate, source, and drain inductances, respectively, and Cpg and Cpd are the gate and drain parasitic capacitances, respectively. The analysis was carried out using the oscillator testing bench prepared for the microwave simulator produced by the HP EEsof Inc. and named "Series-IV Libra".

Figure 5:
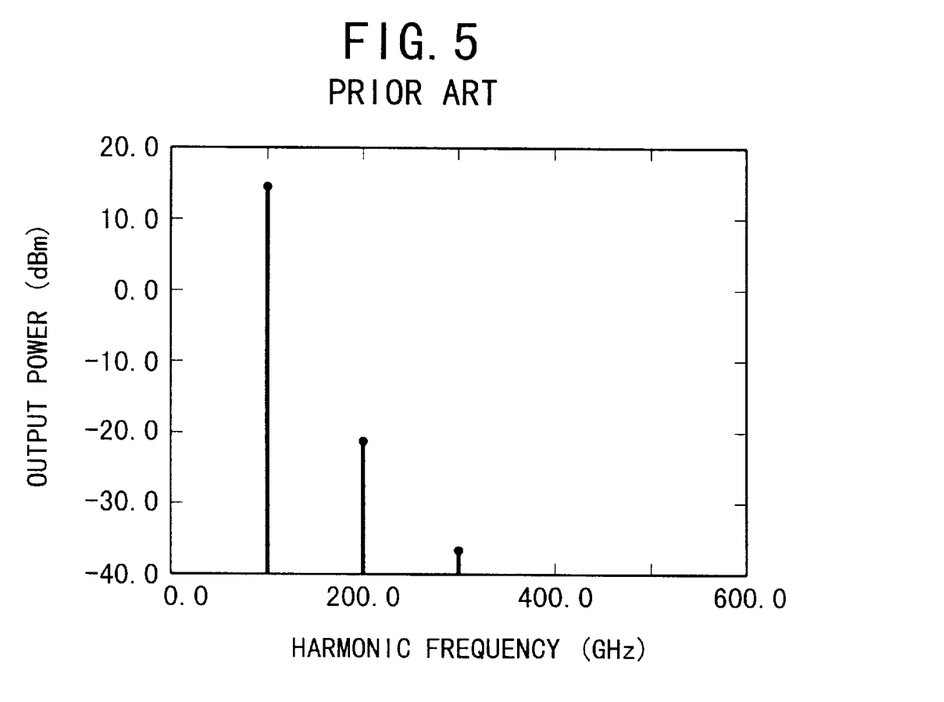
FIG. 5 is a graph showing the simulation result of the prior-art oscillator of FIG. 3, in which the frequency characteristic of the output power is shown.
Figure 6:
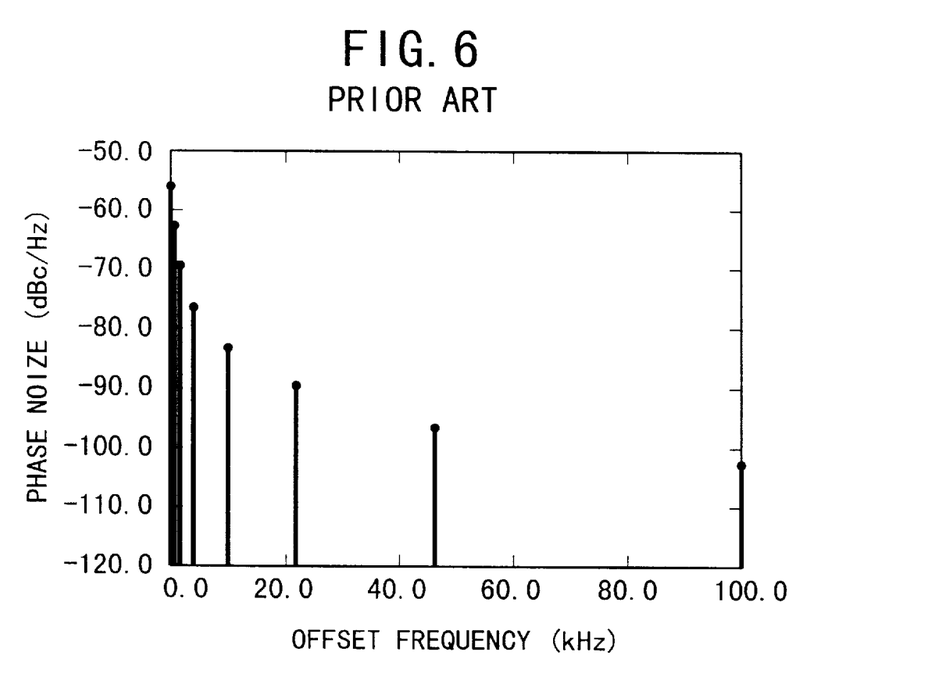
FIG. 6 is a graph showing the simulation result of the prior-art oscillator of FIG. 3, in which the frequency characteristic of the phase noise is shown.

The simulation result thus obtained is shown in FIGS. 5 and 6. FIG. 5 shows the output power characteristic of the prior-art oscillator of FIG. 3, in which the output power is 14.2 dBm at the frequency of 99.3 GHz. In this case, the phase noise is given as shown in FIG. 6, in which the phase noise is -103.0 dBc/Hz at the offset frequency of 100 kHz.

The measured value of the phase noise of the prior-art oscillator of FIG. 3 was approximately −60 to −40 dBc/Hz at the highest at the offset frequency of 100 kHz from the oscillation frequency of 100 GHz, which is higher than that of the above-described simulation result. This is due to the fact that the 1/f noise was not considered in the simulation.

As a result, it is found that from the view point of usefulness, the phase noise of the prior-art oscillator of FIG. 3 is not satisfactorily low for the use in the high frequency range of 60 GHz or higher.

As explained above, the prior-art oscillator shown in FIG. 2 has the problem that the mass productivity is not high and the oscillator size or scale is large. The prior-art oscillator shown in FIG. 3 has the problem that the phase noise is high.

SUMMARY OF THE INVENTION

Accordingly, an object of the present invention is to provide a high-frequency oscillator that decreases the phase noise and that has excellent mass productivity and reproducibility.

Another object of the present invention is to provide a high-frequency oscillator that can be realized with a small size.

The above objects together with others not specifically mentioned will become clear to those skilled in the art from the following description.

A high-frequency oscillator according to the present invention is comprised of:
 (a) first, second, and third FETs formed on a substrate;
 (b) a first transmission line formed on the substrate;
  the first line being connected to drains of the first and second FETs formed on the substrate;
 (c) a second transmission line formed on the substrate;
  the second line being connected to gates of the first and second FETs;
 (d) a third transmission line formed on the substrate;
  the third line being connected to sources of the first and second FETs;
 (e) a fourth transmission line formed on the substrate;
  the fourth line being connected to the drain of the second FET and a drain of the third FET;
 (f) a fifth transmission line formed on the substrate;
  the fifth line being connected to the gate of the second FET and a gate of the third FET; and
 (g) a sixth transmission line formed on the substrate;
  the sixth line being connected to the source of the second FET and a source of the third FET.

The first, second, and third transmission lines are coupled together due to electromagnetic field, and the fourth fifth, and sixth transmission lines are coupled together due to electromagnetic field.

With the high-frequency oscillator according to the present invention, the first, second, and third transmission lines are formed on the substrate and coupled together due to electromagnetic field. The fourth, fifth, and sixth transmission lines are formed on the substrate and coupled together due to electromagnetic field. Thus, the phase noise can be drastically decreased while excellent mass productivity and reproducibility are ensured.

Also, since no dielectric resonator is required, the oscillator can be realized with a small size.

In a preferred embodiment of the oscillator according to the invention, first, second, and third inductors are connected to the sources of the first, second, and third FETs, respectively. The first, second, and third inductors serve to generate negative resistances for the first, second, and third FETs, respectively.

In another preferred embodiment of the oscillator according to the invention, seventh, eighth, and ninth transmission lines are connected to the sources of the first, second, and third FETs, respectively. The seventh, eighth, and ninth transmission lines serve to generate negative resistances for the first, second, and third FETs, respectively.

In still another preferred embodiment of the oscillator according to the invention, the drain of the first FET is connected to an output terminal through a dc-blocking capacitor.

In a further preferred embodiment of the oscillator according to the invention, the substrate is made of a semiconductor material such as GaAs. The first to third FETs and the dc-blocking capacitor are formed on the substrate monolithically.

In a still further preferred embodiment of the oscillator according to the invention, the substrate is made of a dielectric material such as $Al_2O_3$. The first to third FETs and the first to sixth transmission lines are mounted on the substrate.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

FIRST EMBODIMENT

Figure 7:
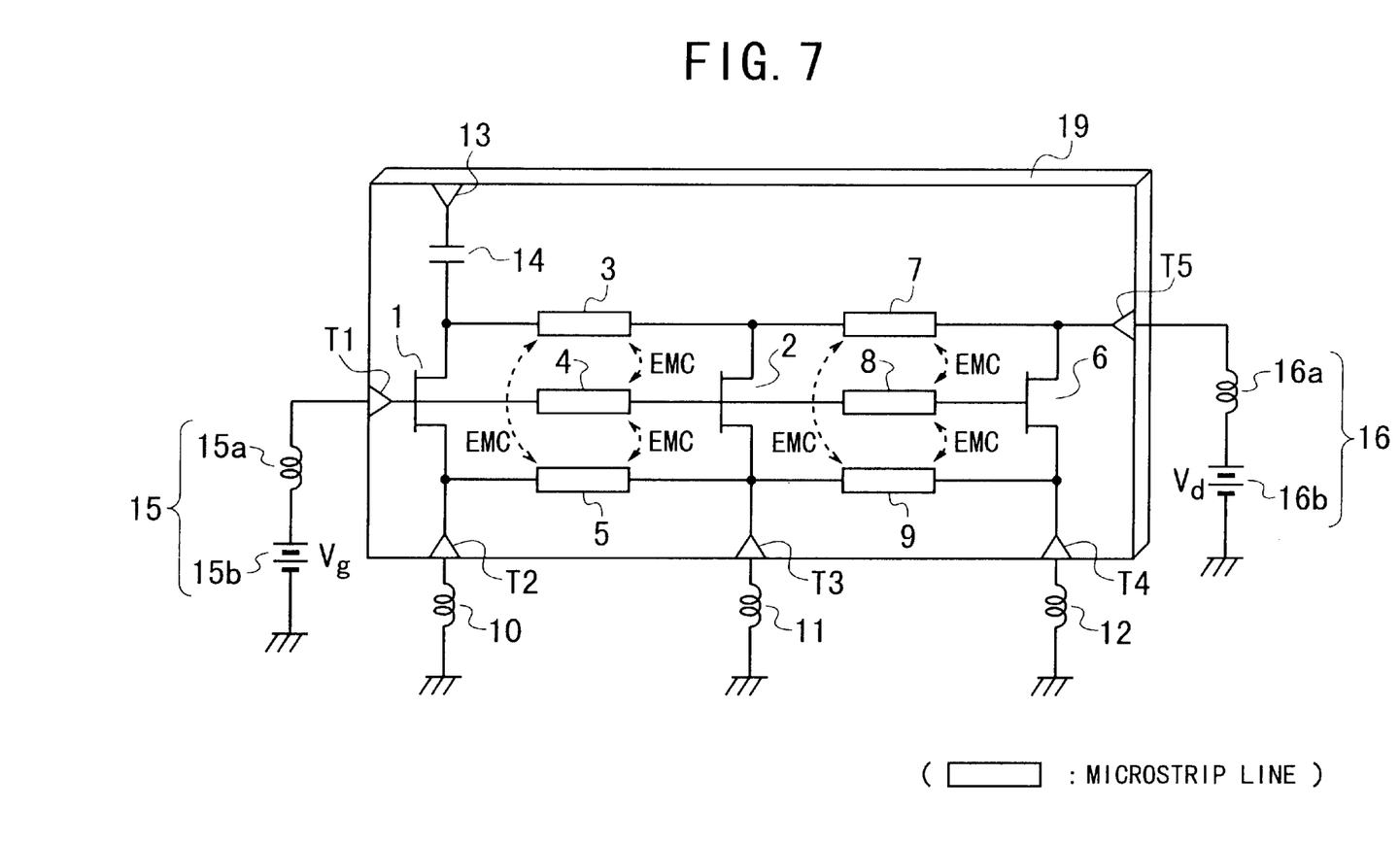
FIG. 7 is a schematic circuit diagram showing the circuit configuration of a high-frequency oscillator according to a first embodiment of the invention.

A high-frequency oscillator according to a first embodiment of the invention has the circuit configuration as shown in FIG. 7.

As seen from FIG. 7, the oscillator comprises three FETs 1, 2, and 6 and six transmission lines 3, 4, 5, 7, 8, and 9, which are formed on a GaAs substrate 19. Each of the lines 3, 4, 5, 7, 8, and 9 is formed by a microstrip line. The lines 3, 4, and 5 are arranged in parallel on the substrate 19 and electromagnetically coupled with each other. In other words, the lines 3, 4, and 5 are coupled together due to the electromagnetic field. Similarly, the lines 7, 8, and 9 are arranged in parallel on the substrate 19 and electromagnetically coupled with each other. In other words, the lines 7, 8, and 9 are coupled together due to the electromagnetic field.

The gate of the first FET 1 is connected to a corresponding end of the transmission line 4. The gate of the first FET 1 is further connected to one terminal of a gate bias circuit 15 through an interconnection terminal T1. The other terminal of the circuit 15 is connected to the ground. The gate bias circuit 15 is provided outside the substrate 19. The terminal T1 is formed on the substrate 19.

The gate bias circuit 15 has an inductor 15a and a voltage source 15b supplying a bias voltage $V_g$, which are serially connected to each other. The circuit 15 applies the bias voltage $V_g$ to the gate of the first FET 1. The inductor 15a serves to increase the impedance of the gate bias line to a desired value at a specific operating or oscillation frequency.

The drain of the first FET 1 is connected to a corresponding end of the transmission line 3. The drain of the FET 1 is further connected through a dc-blocking capacitor 14 to an output terminal 13 of the oscillator. The output terminal 13 and the capacitor 14 are formed on the substrate 19.

The source of the first FET 1 is connected to a corresponding end of the transmission line 5. The source of the FET 1 is further connected to one terminal of a feedback inductor 10 through an interconnection terminal T2. The other terminal of the inductor 10 is connected to the ground. The inductor 10 serves to generate a desired negative resistance for the FET 1. The terminal T2 is formed on the substrate 19.

The gate of the second FET 2 is connected to corresponding ends of the transmission lines 4 and 8. The drain of the FET 2 is connected to corresponding ends of the transmission lines 3 and 7. The source of the FET 2 is connected to corresponding ends of the transmission lines 5 and 9. The source of the FET 2 is further connected to one terminal of a feedback inductor 11 through an interconnection terminal T3. The other terminal of the inductor 11 is connected to the ground. The inductor 11 is provided outside the substrate 19.

The inductor 11 serves to generate a desired negative resistance for the FET 2. The terminal T3 is formed on the substrate 19.

The gate of the third FET 6 is connected to a corresponding end of the transmission line 8. The drain of the FET 6 is connected to a corresponding end of the transmission line 7. The drain of the FET 6 is further connected to one terminal of a drain bias circuit 16 through an interconnection terminal T5. The other terminal of the circuit 16 is connected to the ground. The circuit 16 is provided outside the substrate 19. The terminal T5 is formed on the substrate 19.

The drain bias circuit 16 has an inductor 16a and a voltage source 16b supplying a bias voltage $V_d$, which are serially connected to each other. The circuit 16 applies the bias voltage $V_d$ to the drain of the FET 6. The inductor 16a serves to increase the impedance of the drain bias line to a desired value at the specific operating or oscillation frequency.

The source of the third FET 6 is connected to a corresponding end of the transmission line 9. The source of the FET 6 is further connected to one terminal of a feedback inductor 12 through an interconnection terminal T4. The other terminal of the inductor 12 is connected to the ground. The inductor 12 serves to generate a desired negative resistance for the FET 6. The terminal T4 is formed on the substrate 19.

With the high-frequency oscillator according to the first embodiment of FIG. 7, the three transmission lines 3, 4, and 5 are arranged in parallel on the substrate 19 and electromagnetically coupled with each other, and the remaining three transmission lines 7, 8, and 9 are arranged in parallel on the substrate 19 and electromagnetically coupled with each other. Moreover, the first, second, and third FETs 1, 2, 6 are connected to the lines 3, 4, 5, 7, 8, and 9 in the manner as explained above.

Accordingly, although the detailed operation principle has not been understood yet, the oscillator load $Q_L$ is increased and at as a result, the phase noise is drastically decreased.

Since no dielectric resonator is used, excellent mass productivity and reproducibility can be obtained, and a high-frequency oscillator can be realized with a small size.

To examine the performance of the oscillator according to the first embodiment of FIG. 7, the inventor carried out simulation in the same manner as explained previously under the following condition.

On the assumption that the GaAs substrate 19 has a thickness of 40 $\mu$m, the relative dielectric constant $\epsilon r$ was set as 12.6. Each of the first to third FETs 1, 2, and 6 was supposed to have the AlGaAs/InGaAs heterojunction, the gate length Lg of 0.18 $\mu$m, and the gate width Wg of 200 $\mu$m. Then, a nonlinear FET model was obtained by using the "Curtice Cubic" model. Using the nonlinear FET model thus obtained, the output power of the oscillator of FIG. 7 was analyzed by the Harmonic Balance method while the nonlinear FET parameters as shown in FIG. 4 were used. The analysis was carried out using the oscillator testing bench prepared for the microwave simulator produced by the HP EEsof Inc. and named "Series-IV Libra".

The gate bias voltage $V_g$ was set as −0.3V, and the drain bias voltage $V_d$ was set as 5V.

The transmission lines 3 and 7 were supposed to be microstrip lines with a width of 50 $\mu$m and a length of 200 $\mu$m. The transmission lines 4 and 8 were supposed to be microstrip lines with a width of 40 $\mu$m and a length of 200 $\mu$m. The transmission lines 5 and 9 were supposed to be microstrip lines with a width of 20 $\mu$m and a length of 200 $\mu$m.

The interval between the lines 3 and 4 and that between the lines 7 and 8 were set as 4 μm. The interval between the lines 5 and 4 and that between the lines 9 and 8 were set as 5 μm.

The inductance of the inductors 10, 11, and 12 for generating the negative resistance were set as 5 pH. The capacitance of the dc-blocking capacitor 14 was set as 1 pF.

A resistor of 50Ω was connected to the output terminal 13 as the load resistor.

Figure 8:
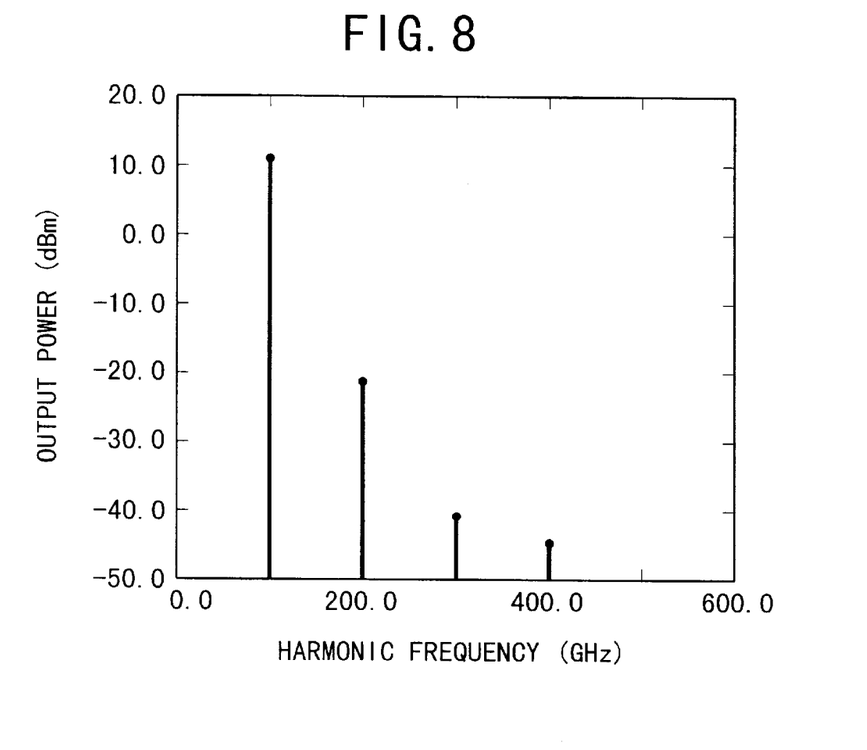
FIG. 8 is a graph showing the simulation result of the oscillator according to the first embodiment of FIG. 7, in which the frequency characteristic of the output power is shown.
Figure 9:
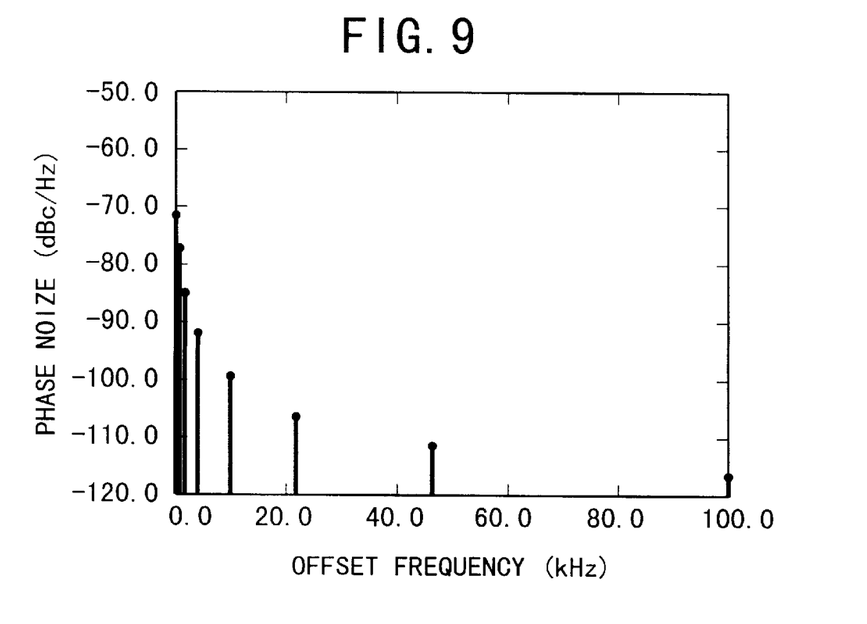
FIG. 9 is a graph showing the simulation result of the oscillator according to the first embodiment of FIG. 7, in which the frequency characteristic of the phase noise is shown.

The simulation result thus obtained is shown in FIGS. 8 and 9. FIG. 8 shows the relationship between the output power and the harmonic frequency of the oscillator according to the first embodiment of FIG. 7. FIG. 9 shows the offset frequency dependence of the phase noise of the same oscillator.

As seen from FIG. 8, the output power was 11.5 dBm at the frequency of 99.1 GHz. As seen from FIG. 9, the phase noise was −118.8 dBc/Hz at the offset frequency of 100 kHz, which is lower than that (−103.0 dBc/Hz) in the prior-art oscillator shown in FIG. 3. Thus, with the oscillator of the first embodiment, the phase noise can be decreased by 15.8 dB compared with the prior-art oscillator. This value of 15.8 dB corresponds to the increase of the load $Q_L$ by six times.

SECOND EMBODIMENT

Figure 10:
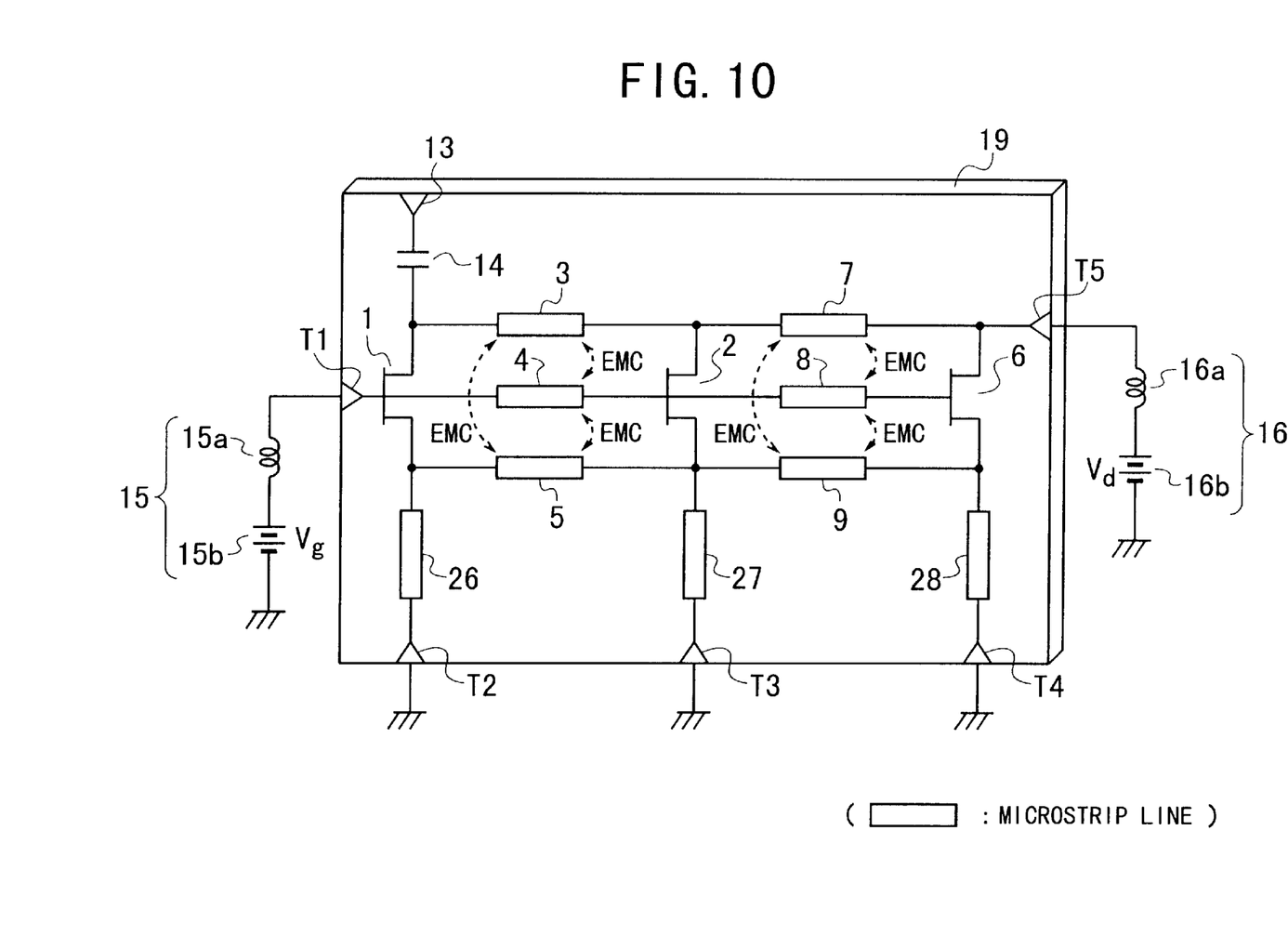
FIG. 10 is a schematic circuit diagram showing the circuit configuration of a high-frequency oscillator according to a second embodiment of the invention.

FIG. 10 shows a high-frequency oscillator according to a second embodiment of the invention, which has the same configuration as that of the first embodiment except that transmission lines 26, 27, and 28 are used instead of the inductors 10, 11, and 12 in the first embodiment. Accordingly, the explanation about the same configuration is omitted here for simplification of description by attaching the same reference symbols as those used in the first embodiment in FIG. 10.

As shown in FIG. 10, the transmission lines 26, 27, and 28 are microstrip lines formed on the GaAs substrate 19. The line 26 is connected to the source of the first FET 1 and the interconnection terminal T2. The line 27 is connected to the source of the second FET 2 and the interconnection terminal T3. The line 28 is connected to the source of the third FET 6 and the interconnection terminal T4.

To examine the performance of the oscillator according to the second embodiment of FIG. 10, the inventor carried out simulation in the same manner as explained in the first embodiment under the following condition.

The transmission lines 26, 27, and 28 were supposed to be microstrip lines with a width of 5 μm and a length of 10 μm. The other parameters were the same as those in the first embodiment.

Figure 11:
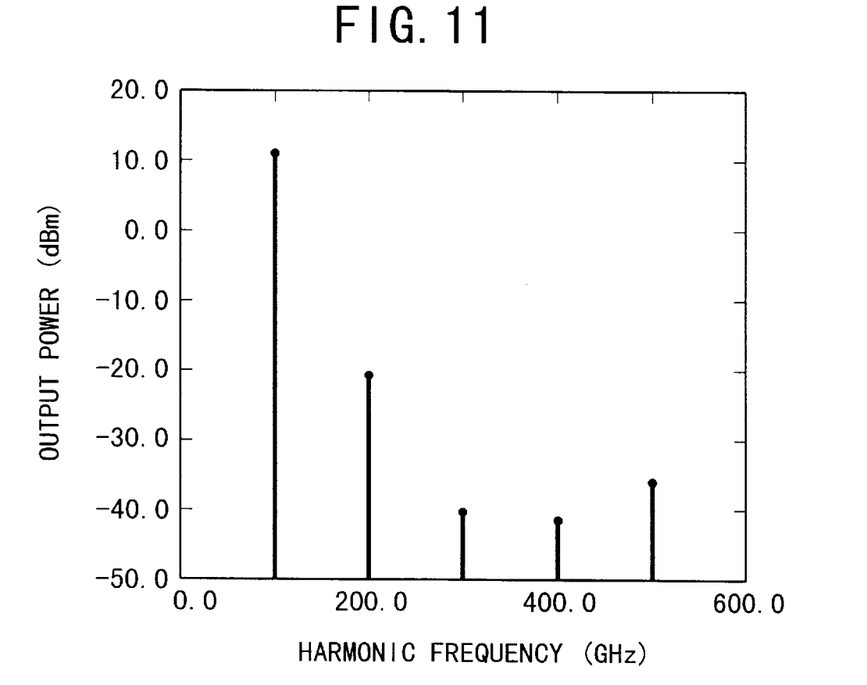
FIG. 11 is a graph showing the simulation result of the oscillator according to the second embodiment of FIG. 10, in which the frequency characteristic of the output power is shown.
Figure 12:
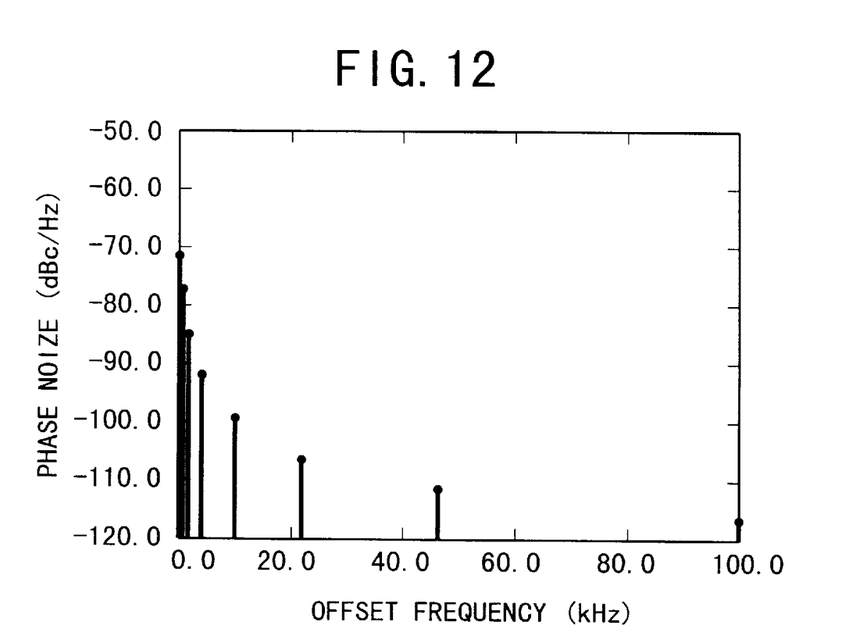
FIG. 12 is a graph showing the simulation result of the oscillator according to the second embodiment of FIG. 10, in which the frequency characteristic of the phase noise is shown.

The simulation result thus obtained is shown in FIGS. 11 and 12. FIG. 11 shows the relationship between the output power and the harmonic frequency of the oscillator according to the second embodiment of FIG. 10. FIG. 12 shows the offset frequency dependence of the phase noise of the same oscillator.

As seen from FIG. 11, the output power was 11.8 dBm at the frequency of 99.8 GHz. As seen from FIG. 12, the phase noise was −118.2 dBc/Hz at the offset frequency of 100 kHz, which is lower than that (−103.0 dBc/Hz) in the prior-art oscillator shown in FIG. 3. Thus, with the oscillator of the second embodiment, the phase noise can be decreased by 15.1 dB compared with the prior-art oscillator. This value of 15.1 dB corresponds to the increase of the load $Q_L$ by about six times.

THIRD EMBODIMENT

Figure 13:
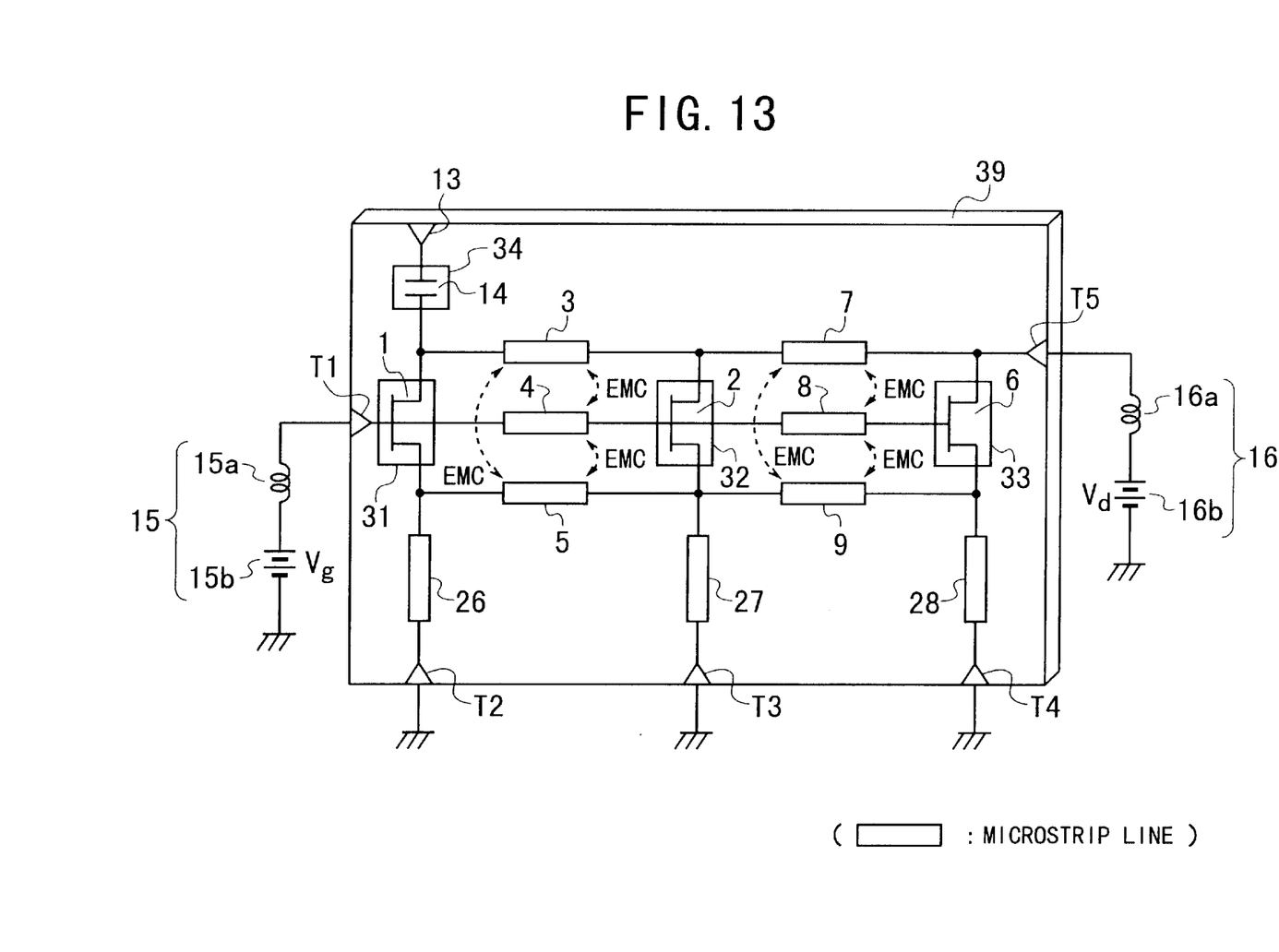
FIG. 13 is a schematic circuit diagram showing the circuit configuration of a high-frequency oscillator according to a third embodiment of the invention.

FIG. 13 shows a high-frequency oscillator according to a third embodiment of the invention, which has the same configuration as that of the second embodiment except that an alumina ($Al_2O_3$) substrate 39 is used instead of the GaAs substrate 19 in the first embodiment. Accordingly, the explanation about the same configuration is omitted here for simplification of description by attaching the same reference symbols as those used in the second embodiment in FIG. 13.

As seen from FIG. 13, because of the substrate 39 is dielectric, the first to third FETs 1, 2, and 6 are formed by discrete transistors 31, 32, and 33, respectively. The capacitor 14 also is formed by a discrete capacitor component 34. The transistors 31, 32, and 33, and the capacitor component 34 are mounted on the substrate 39 by the well-known flip-chip bonding technique.

To examine the performance of the oscillator according to the third embodiment of FIG. 13, the inventor carried out simulation in the same manner as explained in the first embodiment under the following condition.

On the assumption that the $Al_2O_3$ substrate 39 has a thickness of 25 mil (=25/1000 inch), the relative dielectric constant $\epsilon r$ was set as 10. The configuration and parameter values of the first to third FETs 1, 2, and 6 were the same as those in the first embodiment.

The gate bias voltage $V_g$ was set as −0.3V, and the drain bias voltage $V_d$ was set as 5V.

The transmission lines 3 and 7 were supposed to be microstrip lines with a width of 50 mil and a length of 200 mil. The transmission lines 4 and 8 were supposed to bemicrostrip lines with a width of 40 mil and a length of 200 mil. The transmission lines 5 and 9 were supposed to be microstrip lines with a width of 20 mil and a length of 200 mil.

The interval between the lines 3 and 4 and that between the lines 7 and 8 were set as 5 mil. The interval between the lines 5 and 4 and that between the lines 9 and 8 were set as 5 mil.

The transmission lines 26, 27, and 28 were supposed to be microstrip lines with a width of 5 mil and a length of 30 mil.

Figure 14:
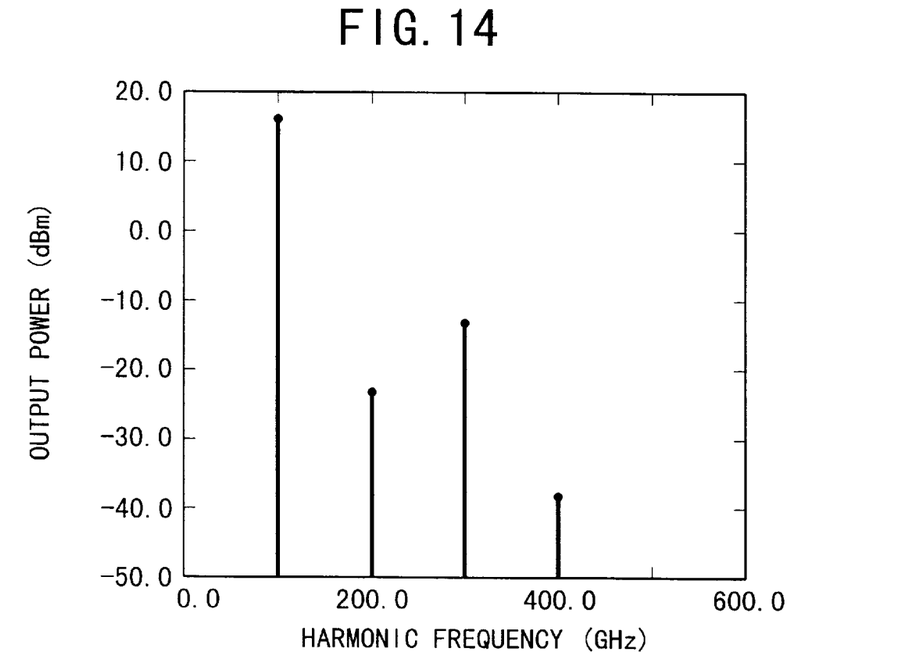
FIG. 14 is a graph showing the simulation result of the oscillator according to the third embodiment of FIG. 13, in which the frequency characteristic of the output power is shown.
Figure 15:
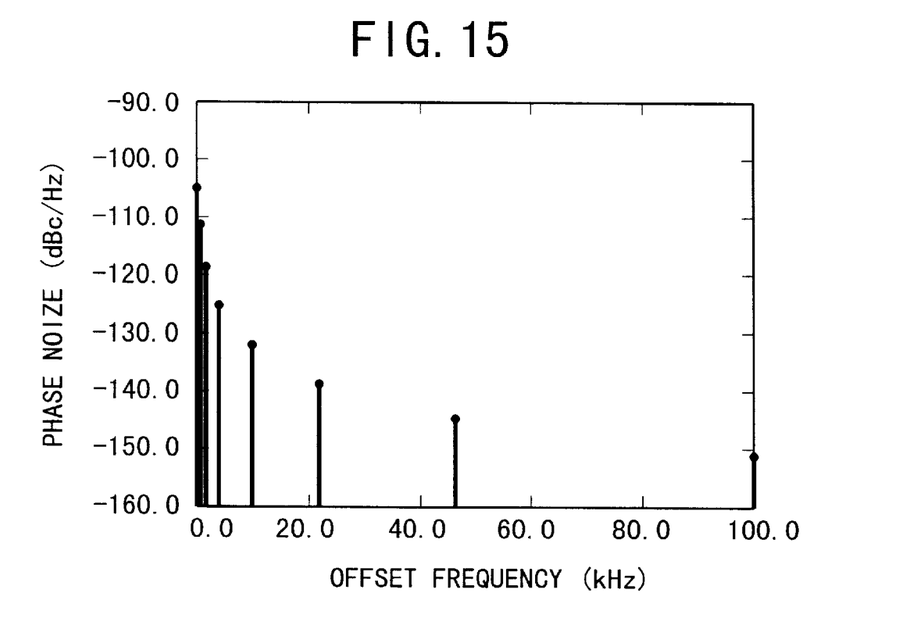
FIG. 15 is a graph showing the simulation result of the oscillator according to the third embodiment of FIG. 13, in which the frequency characteristic of the phase noise is shown.

The simulation result thus obtained is shown in FIGS. 14 and 15. FIG. 14 shows the relationship between the output power and the harmonic frequency of the oscillator according to the third embodiment of FIG. 13. FIG. 15 shows the offset frequency dependence of the phase noise of the same oscillator.

As seen from FIG. 14, the output power was 16.0 dBm at the harmonic frequency of 99.0 GHz. As seen from FIG. 15, the phase noise was −151.8 dBc/Hz at the offset frequency of 100 kHz, which is lower than that (−103.0 dBc/Hz) in the prior-art oscillator shown in FIG. 3. Thus, with the oscillator of the third embodiment, the phase noise can be decreased by 48.8 dB compared with the prior-art oscillator. This value of 48.8 dB corresponds to the increase of the load $Q_L$ by about 275 times.

As described above, with the high-frequency oscillators according to the first to third embodiments, the phase noise can be drastically decreased (e.g., 15 dB to 48 dB) compared with the prior-art oscillator shown in FIG. 3 while excellent mass productivity and reproducibility are ensured. Also, they can be realized with a small size.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A high-frequency oscillator comprising:
   (a) first, second, and third FETs formed on a substrate;
   (b) a first transmission line formed on the substrate;
       said first transmission line being connected to drains of said first and second FETs formed on said substrate;
   (c) a second transmission line formed on said substrate;
       said second transmission line being connected to gates of said first and second FETs;
   (d) a third transmission line formed on said substrate;
       said third transmission line being connected to sources of said first and second FETs;
   (e) a fourth transmission line formed on said substrate;
       said fourth transmission line being connected to said drain of said second FET and a drain of said third FET;
   (f) a fifth transmission line formed on said substrate;
       said fifth transmission line being connected to said gate of said second FET and a gate of said third FET; and
   (g) a sixth transmission line formed on said substrate;
       said sixth transmission line being connected to said source of said second FET and a source of said third FET;
   wherein said first, second, and third transmission lines are coupled together due to electromagnetic field, and said fourth, fifth, and sixth transmission lines are coupled together due to electromagnetic field.

2. The oscillator according to claim 1, further comprising first, second, and third inductors connected to said sources of said first, second, and third FETs, respectively;
   wherein said first, second, and third inductors serve to generate negative resistances for said first, second, and third FETs, respectively.

3. The oscillator according to claim 1, further comprising seventh, eighth, and ninth transmission lines connected to said sources of said first, second, and third FETs, respectively;
   wherein said seventh, eighth, and ninth transmission lines serve to generate negative resistances for said first, second, and third FETs, respectively.

4. The oscillator according to claim 1, wherein said drain of said first FET is connected to an output terminal through a dc-blocking capacitor.

5. The oscillator according to claim 1, wherein said substrate is made of a semiconductor material;
   and wherein said first to third FETs and said first to sixth transmission lines are formed on said substrate monolithically.

6. The oscillator according to claim 5, wherein said substrate is made of GaAs.

7. The oscillator according to claim 1, wherein said substrate is made of a dielectric material;
   and wherein said first to third FETs and said dc-coupling capacitor are mounted on said substrate.

8. The oscillator according to claim 7, wherein said substrate is made of $Al_2O_3$.

9. The oscillator according to claim 1, wherein an oscillation frequency is in the microwave or millimeter-wave range.

* * * * *